United States Patent
Lopatin et al.

[11] Patent Number: 6,015,747
[45] Date of Patent: Jan. 18, 2000

[54] METHOD OF METAL/POLYSILICON GATE FORMATION IN A FIELD EFFECT TRANSISTOR

[75] Inventors: Sergey Lopatin, Santa Clara; Takeshi Nogami, Sunnyvale; Shekhar Pramanik, Fremont, all of Calif.

[73] Assignee: Advanced Micro Device, Sunnyvale, Calif.

[21] Appl. No.: 09/206,799

[22] Filed: Dec. 7, 1998

[51] Int. Cl.[7] .......................... H01L 21/28; H01L 21/335
[52] U.S. Cl. ........................... 438/586; 438/592; 438/678
[58] Field of Search .................................. 438/586, 592, 438/678; 427/98, 304, 305

[56] References Cited

U.S. PATENT DOCUMENTS

| | | | |
|---|---|---|---|
| 4,692,349 | 9/1987 | Georgiou et al. | 438/655 |
| 5,063,169 | 11/1991 | De Bruin et al. | 438/675 |
| 5,268,330 | 12/1993 | Given et al. | 438/586 |
| 5,342,806 | 8/1994 | Asahina | 438/608 |

OTHER PUBLICATIONS

Advanced Metallization and Interconnect Systems for ULSI Applications in 1997 by S. Lopatin Y. Shacham–Diamond, V. Dubin, P.K. Vasudev, Y. Kin, T. Smy, Oct. 21–22, 1997, MRS, pp. 437–443.

Selective electroless Ni deposition onto Pd–activated Si for integrated circuit fabrication by V.M. Dubin, S.D. Lopatin and V.G. Sokolov, Apr. 29, 1992, Thin Solid Films, vol. 226, pp. 94–98.

*Primary Examiner*—T. N. Quach
*Attorney, Agent, or Firm*—Brinks Hofer Gilson & Lione

[57] ABSTRACT

A method for manufacturing a field effect transistor (100) includes forming source and drain regions (110, 112) in a semiconductor substrate (102) and forming a polysilicon gate (104) on a surface (106) of the semiconductor substrate adjacent to the source and drain regions. A masking layer (136) is formed, covering substantially all the semiconductor substrate. Portions of the masking layer are then selectively removed to expose at least selected portions of the polysilicon gate. Selected portions of the polysilicon gate are partially etched. By selective electroless metal deposition, a metal layer (146) is formed on the etched selected portions of the polysilicon gate. In an alternative embodiment, the masking layer is removed before selective deposition of the electroless metal, so that electroless metal is simultaneously deposited on the polysilicon gate and the source region and the drain region.

13 Claims, 4 Drawing Sheets

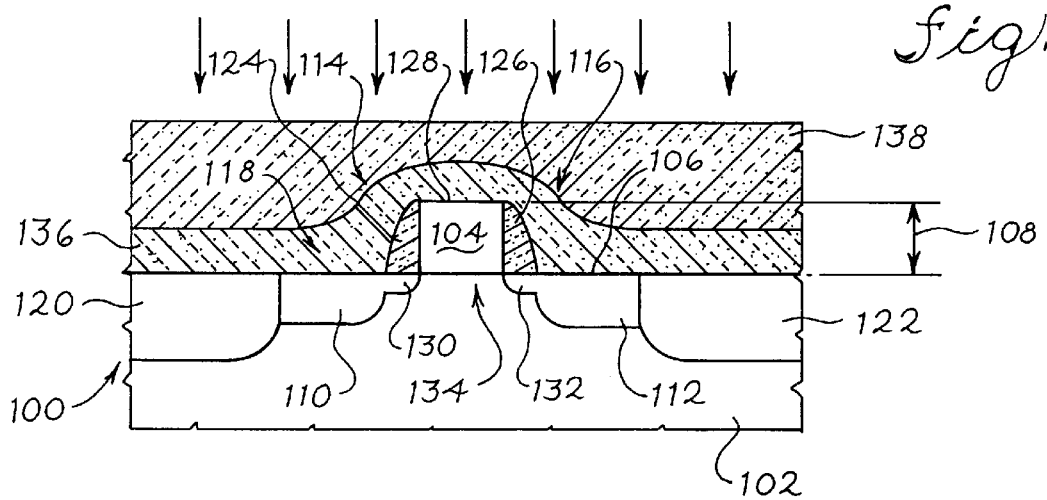
Fig. 1
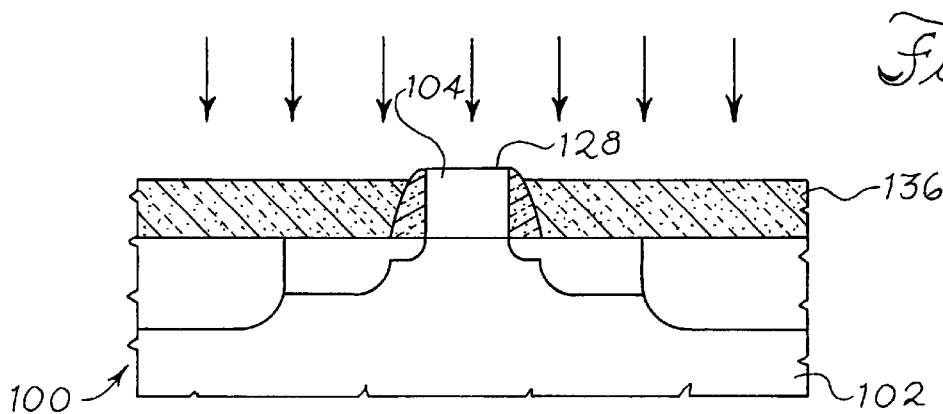
Fig. 2
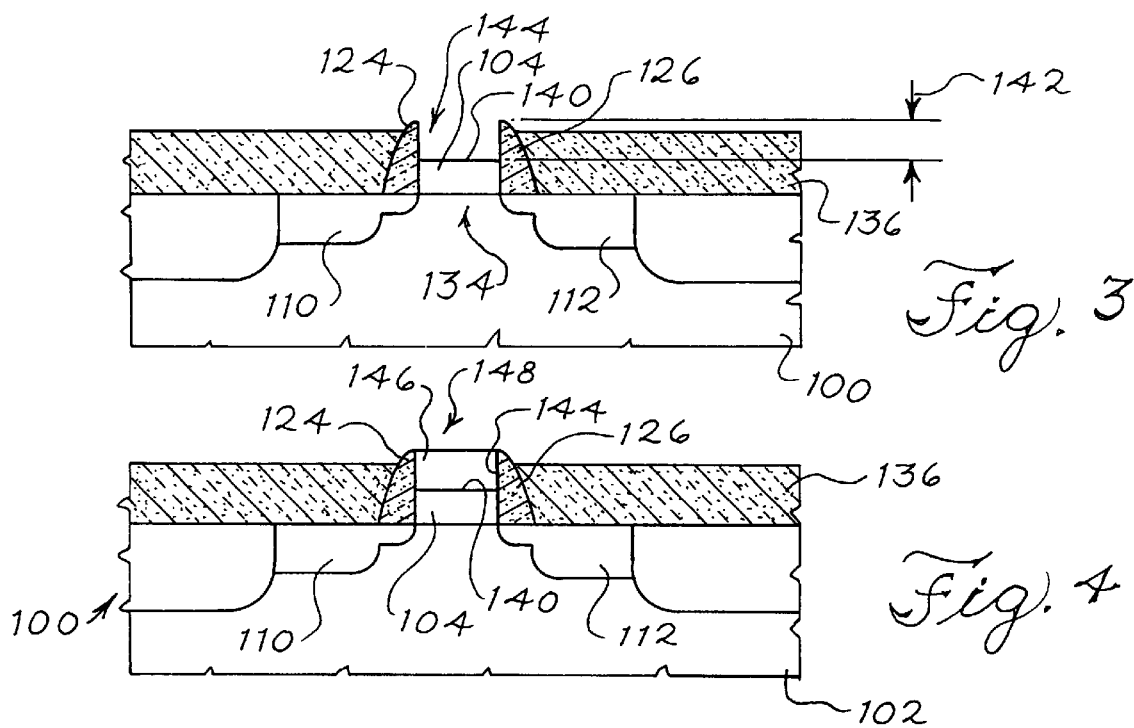
Fig. 3
Fig. 4

METHOD OF METAL/POLYSILICON GATE FORMATION IN A FIELD EFFECT TRANSISTOR

FIELD OF THE INVENTION

The present invention relates generally to semiconductor devices. More particularly, the present invention relates to manufacture of field effect transistors and integrated circuits.

BACKGROUND OF THE INVENTION

Techniques for manufacturing seminconductor devices such as integrated circuits continue to improve. Present photolithography equipment allows minimum line widths of 0.18 μm in current generation devices. Sub-0.15 μm line widths will be available for next-generation devices. These narrow line widths create fabrication and operational problems in all structures of an integrated circuit. Among these affected structures are polysilicon gates of field effect transistors and metalization used for electrical interconnect.

One solution proposed for application to sub-0.25 μm complimentary metal-oxide-semiconductor (CMOS) integrated circuits is using silicide materials such as titanium silicide, cobalt silicide and nickel silicide. Conventionally, the metal is blanket deposited on the surface of a metal semi-conductor wafer during fabrication. However, this can result in short circuit failures between the gate and source/drain, known as bridging. Such failures occur, particularly in the case of titanium silicide, because most of the silicidation takes place in the metal area deposited on the silicon wafer. Silicon atoms are drawn in from the silicon gate source/drain regions. Titanium silicide has a further problem in the form of narrow line effects, such as disconnected grains, in the titanium silicide.

Accordingly, there is a need for a technique for manufacturing a field effect transistor and an integrated circuit which overcomes these and other problems.

BRIEF SUMMARY OF THE INVENTION

The present invention therefore provides a method for manufacturing a field effect transistor. The method comprises the steps of forming source and drain regions in a semiconductor substrate, forming a polysilicon gate on a surface of the semiconductor substrate adjacent to the source and drain regions and forming a masking layer covering substantially all the semiconductor substrate. The method further includes the steps of selectively removing portions of the masking layer from at least selected portions of polysilicon gate and, by selective electroless metal deposition, forming a metal/polysilicon layer on the selected portions of the polysilicon gates.

The invention further provides a method for manufacturing a field effect transistor, including steps of forming a polysilicon gate on a surface of a semiconductor substrate, the polysilicon gate having a predetermined thickness, and forming a source region and a drain region in a semiconductor substrate. The method further includes the steps of forming a first spacer immediately adjacent to the first side of the polysilicon gate and a second spacer immediately adjacent to the second side of the polysilicon gate. The first spacer and the second spacer extend from the surface of the semiconductor substrate to a top surface of the polysilicon gate. The method further includes a step of exposing a deposition surface, including removing a part of the polysilicon gate between the first spacer and the second spacer to an etch depth, the etch depth being less than the predetermined thickness of the polysilicon gate. The first spacer, the second spacer and the deposition surface of the polysilicon gate define a trench. The method further includes filling the trench by selectively depositing electroless metal in the trench to form a metal/polysilicon gate.

BRIEF DESCRIPTION OF THE SEVERAL VIEWS OF THE DRAWINGS

FIG. 1 through FIG. 7 are cross sectional views showing steps in the manufacture of a field effect transistor.

DETAILED DESCRIPTION OF THE PRESENTLY PREFERRED EMBODIMENTS

Figure 5:
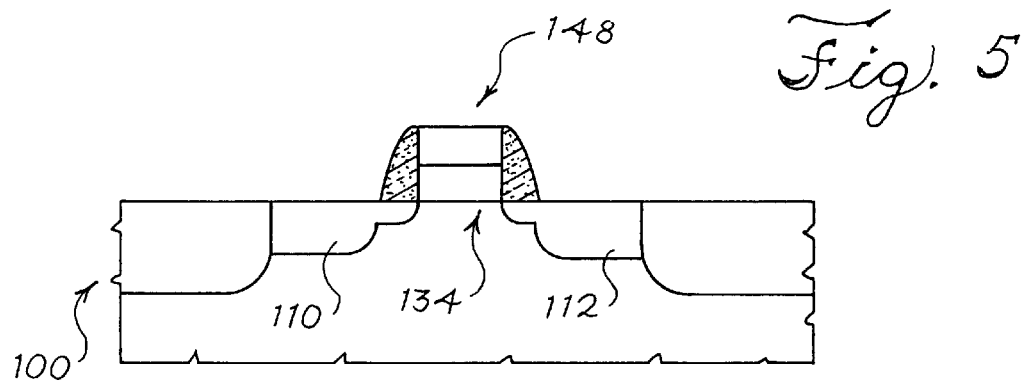

Referring now to FIG. 1, it shows a cross-sectional view of a field effect transistor 100 illustrating one step in the manufacture of the field effect transistor 100. The field effect transistor 100 is formed in a semiconductor substrate 102. The semiconductor substrate 102 may be a portion of a semiconductor wafer, for example made of silicon or another seminconductor material, or the semiconductor substrate 102 may be a portion of an integrated circuit which includes the field effect transistor 100.

As illustrated in FIG. 1, the field effect transistor 100 includes a polysilicon gate 104 formed on a surface 106 of the semiconductor substrate 102. The polysilicon gate 104 has a predetermined thickness 108. The predetermined thickness 108 corresponds to the height of the polysilicon gate 104 above the surface 106 of the semiconductor surface 102. The polysilicon gate 104 is formed from polysilicon deposited as a single layer upon the surface 106 of the semiconductor substrate 102 and patterned using conventional semiconductor photolithography techniques to define the shape of the polysilicon gate 104.

Source and drain regions are defined on either side of the polysilicon gate 104. A source region 110 is formed in the semiconductor substrate 102 on a first side 114 of the polysilicon gate 104. A drain region 112 is formed on the semiconductor substrate 102 on a second side 116 of the polysilicon gate 104. Designation of the source region 110 and drain region 112 as the source and drain of the field effect transistor 100 is arbitrary. The source region 110 and the drain region 112 are interchangeable in the operation of the field effect transistor 100.

In conventional semiconductor device processing, the source region 110 and the drain region 112 are defined in a diffusion area surrounded by field oxide on the surface of the semiconductor substrate 102. A layer of field oxide is grown on the surface of a wafer and patterned using conventional manufacturing techniques. Active areas, such as active area 118 are formed in between oxide islands, such as field oxide 120 and field oxide 122. Field oxide islands isolate active areas from each other. Oxide islands are designated by cross hatching in FIGS. 1–7.

Oxide spacers are defined on either side of the polysilicon gate 104. A first spacer 124 is formed immediately adjacent the first side 114 of the polysilicon gate 104. A second spacer 126 is formed immediately adjacent the second side 116 of the polysilicon gate 104. The first spacer 124 and the second spacer 126 extend from the surface 106 of the semiconductor substrate 102 to substantially a top surface 128 of the polysilicon gate 104. The spacers are formed using conventional techniques, by depositing a layer of silicon dioxide or other suitable material on the surface of the semiconductor substrate 102, patterning the silicon dioxide and etching away all but the silicon spacers, including first spacer 124 and second spacer 126.

The first spacer 124 and the second spacer 126 are used for forming lightly doped drain regions, including a source extension 130 and a drain extension 132. The source extension 130 and the drain extension 132 are relatively lightly doped and are used to reduce short channel effects in the field effect transistor 100. The source region 110, the source extension 130, the drain region 112 and the drain extension 132 are all doped to a doping type opposite the doping of the channel region 134 under the polysilicon gate 104.

At the manufacturing step illustrated in FIG. 1, a masking layer 136 has been deposited on the surface 106 of the semiconductor substrate 102. The masking layer 136 can be any suitable material, such as resist, low-K dielectric, silicon dioxide, silicon nitride, or otherwise. A layer of photoresist 138 is formed on top of the masking layer 136. Lastly, in the manufacturing step illustrated in FIG. 1, a reactive ion etching (RIE) operation is performed, as indicated by the arrows in FIG. 1. Reactive ion etching allows closely controlled selective removal of layers and portions of layers during semiconductor processing. The masking layer 136 has been deposited to a depth substantially equal to the predetermined thickness 108 of the polysilicon gate 104. Thus, the photoresist and the masking layer 136 can be removed by reactive ion etching to expose the top surface 128 of the polysilicon gate 104. The remainder of the semiconductor substrate 102, including the source region 110 and the drain region 112 and oxide islands such as oxide island 120 and oxide island 122, remain protected by the masking layer 136. This is illustrated in FIG. 2. Other suitable methods may be used to expose the top surface of the polysilicon gate while protecting the remainder of the semiconductor substrate 102.

FIG. 2 is a cross-sectional view of the field effect transistor 100. In FIG. 2, the masking layer 136 has been etched by reactive ion etching or any other suitable technique to expose the top surface 128 of the polysilicon gate 104. The masking layer 136 covers the remainder of the silicon substrate 102, except portions of the polysilicon gate 104 which have been exposed by the reactive ion etch process. In FIG. 2, a second reactive ion etch process occurs to etch the top surface 128 of the polysilicon gate 104.

As can be seen in FIG. 3, the reactive ion etch process exposes a deposition surface 140 of the polysilicon gate 104 by removing a part of the polysilicon gate 104 between the first spacer 124 and the second spacer 126 from the top surface of the polysilicon gate to an etch depth 142. The etch depth 142 is less than the predetermined thickness 108 of the polysilicon gate 104 (FIG. 1) so that a portion of the polysilicon gate 104 remains after the etching step. Following etching, the first spacer 124, the second spacer 126 and the deposition surface 140 of the polysilicon gate 104 define a trench 144. Throughout the reactive ion etch process, the masking layer 136 protects the remainder of the field effect transistor 100, including the source region 110, the drain region 112 and the channel region 134.

FIG. 4 is a cross-sectional view of the transistor 100 at a later stage in the manufacturing process. Following formation of the trench 144, the trench 144 is filled by selectively depositing electroless metal 146 in the trench 144 to form a metal/polysilicon gate 148. Electroless metal deposition occurs by chemical reaction between the deposition surface 140 and a solution containing metal molecules applied to the deposition surface. No power source is required as is the case in electroplating. Deposition of the electroless metal is selective in that the metal molecules are deposited only on the exposed polysilicon gate 104. No or substantially little deposition occurs on areas of the semiconductor substrate 102 which are protected by the masking layer 136. Selective deposition occurs because silicon and polysilicon surfaces such as the polysilicon gate 104, have electronegativity higher than the electronegativity of dielectric materials, such as the masking layer 136. A reduction reaction of metal ions occurs only in areas of high electronegativity. The electroless metal employed in the solution is preferably selected from the group consisting of nickel, cobalt, nickel phosphide, cobalt phosphide, nickel tungsten phosphide and cobalt tungsten phosphide. Before selectively depositing the electroless metal, preferably the deposition surface 140 is treated with an activating catalyst. The activating catalyst is preferably selected from the group consisting of palladium, silver and gold.

FIG. 5 illustrates a cross-sectional view of the field effect transistor 100 at a subsequent processing step. In FIG. 5, the masking layer has been removed to expose the source region 110 and the drain region 112. The metal/polysilicon gate is located between the source region 110 and the drain region 112, above the channel region 134.

Figure 6:
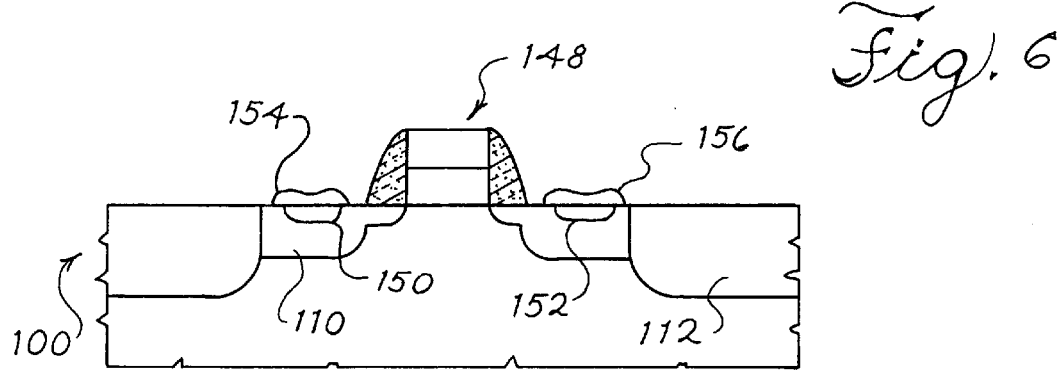

FIG. 6 is a cross-sectional view of the field effect transistor 100 at a subsequent step in the manufacturing process. In FIG. 6, ohmic contacts have been formed in the source region 110 and the drain region 112. At the source region, a source ohmic contact 150 has been formed in the source region 110 and a metal contact 154 has been deposited over the source ohmic contact 150. At the drain region, a drain ohmic contact 152 has been formed and the drain region 112 and a metal contact 156 has been deposited on the ohmic contact. The ohmic contacts are formed using conventional techniques, for example, by diffusing heavily doped contact regions in the source regional 110 and the drain region 112 and depositing metal on the ohmic contact regions. To prevent electrical short circuits between the source region 110, the drain region 112 and the metal/polysilicon gate 148, proper spacing must be maintained between the metal/polysilicon gate 148 and each of the metal contact 154 and the metal contact 156. Further, to insure proper coverage of the source ohmic contact 150 by the metal contact 154 and the drain ohmic contact 152 by the metal contact 156, the metal contacts must be oversized relative to the ohmic contact regions. This oversizing must take into account possible misalignment between the mask used to define the ohmic contacts and the mask used to define the metal contacts. To accommodate all of these requirements, the size of the field effect transistor is extended laterally to the right and left in FIG. 6.

Figure 7:
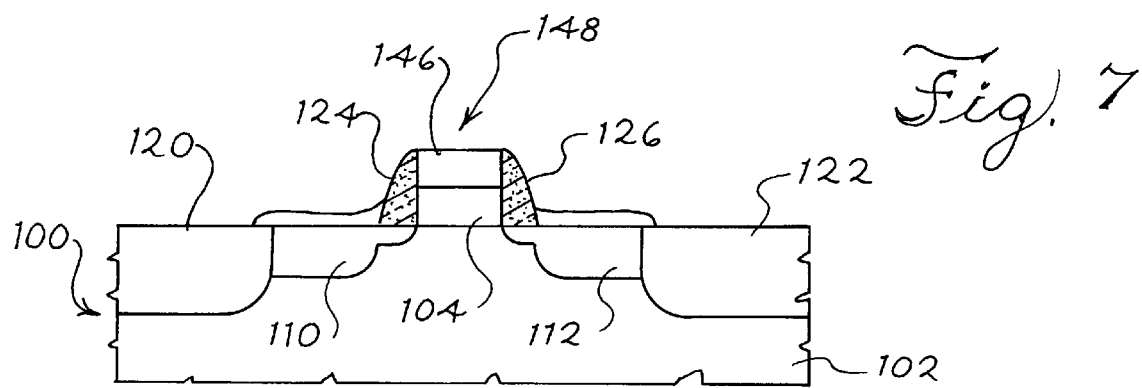

Referring now to FIG. 7, it shows an alternative structure for the transistor 100 constructed in accordance with the method of the present invention. In the process flow illustrated by the drawing, FIG. 7 follows FIG. 3. A portion of the polysilicon gate 104 is removed to create the trench 144 surrounded by the deposition surface 140 and the first spacer 124 and the second spacer 126 (FIG. 3). The masking layer 136 is then removed from the surface of the semiconductor substrate 122. This exposes the source region 110 and the drain region 112. The electroless metal is then selectively deposited on the source region 110 and the drain region 112 to form ohmic contacts to these regions.

FIG. 7 illustrates selective electroless metal deposition on the source region 110, the drain region 112 and on the polysilicon gate 104. As noted above, silicon and polysilicon have electronegativity higher than the electronegativity of a dielectric, such as the field oxide islands 120, 122 and the first spacer 124 and the second spacer 126. As a result, the electroless metal is deposited on the exposed silicon of the source region 110 and the drain region 112 as well as the exposed polysilicon of the polysilicon gate 104. Preferably, an activation solution containing palladium, silver, gold or any other suitable activating catalyst is first applied to the exposed surfaces of silicon and polysilicon. Following activation, a solution containing the electroless metal for deposition is applied to the surfaces.

By selective deposition of electroless metal to both source/drain regions and the polysilicon of the gate, self-aligned metal/polysilicon/source/drain regions are formed in-situ with metal/polysilicon gates. This method allows an increase in the switching speed of the field effect transistor 100 due to the high conductivity of the metal and its alloys in comparison with relatively high resistance of the metal suicides. In addition, bridging between source/drain metalization and gate metalization is eliminated because the selectively deposited electroless metal is not deposited on the insulating surfaces between the source and drain areas and the polysilicon gate. This allows the overall transistor to be smaller in size, thereby increasing its operating speed.

Figure 8:
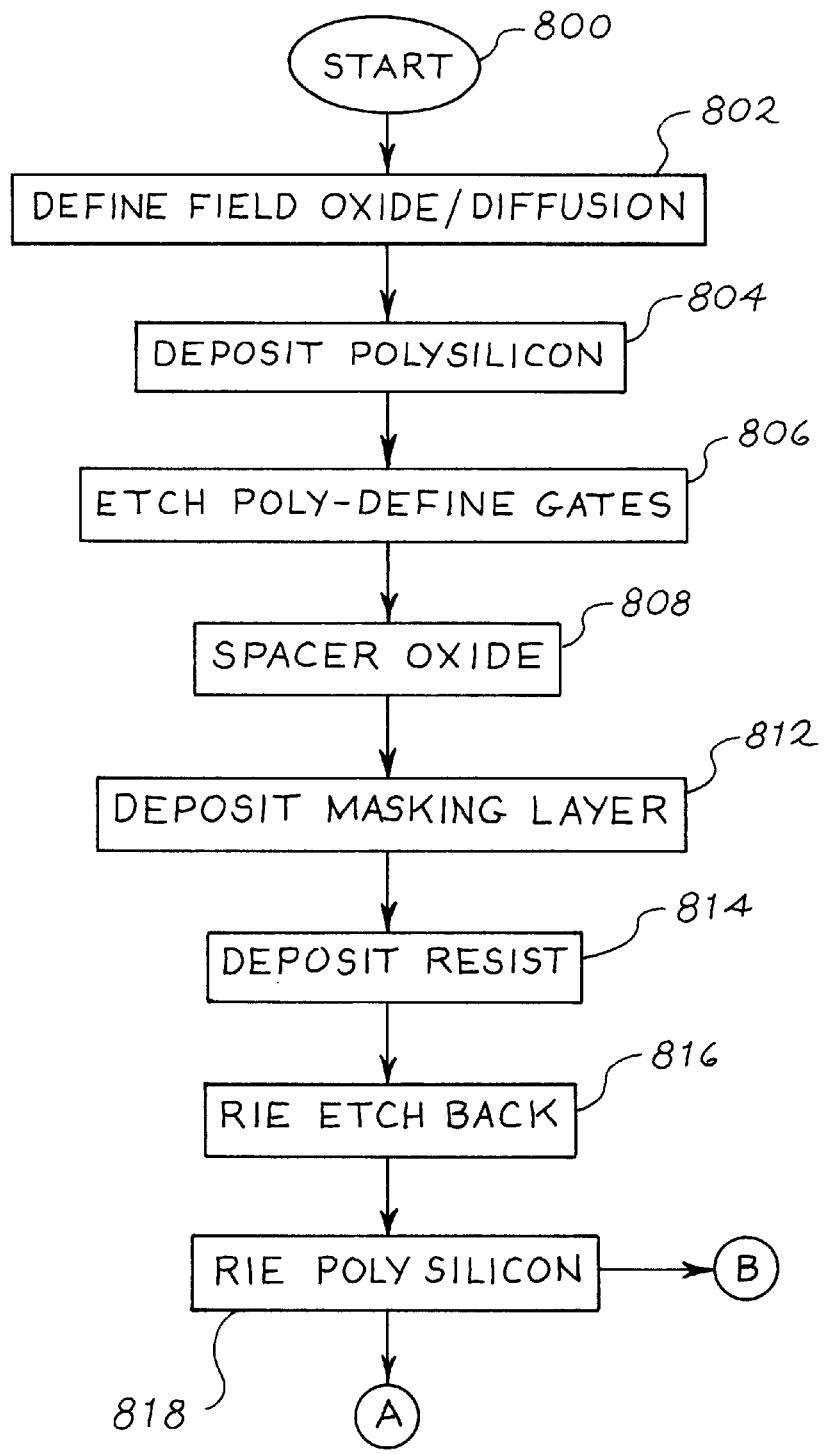
FIG. 8, FIG. 9 and FIG. 10 are a flow diagram showing a method for manufacturing a field effect transistor.
Figure 9:
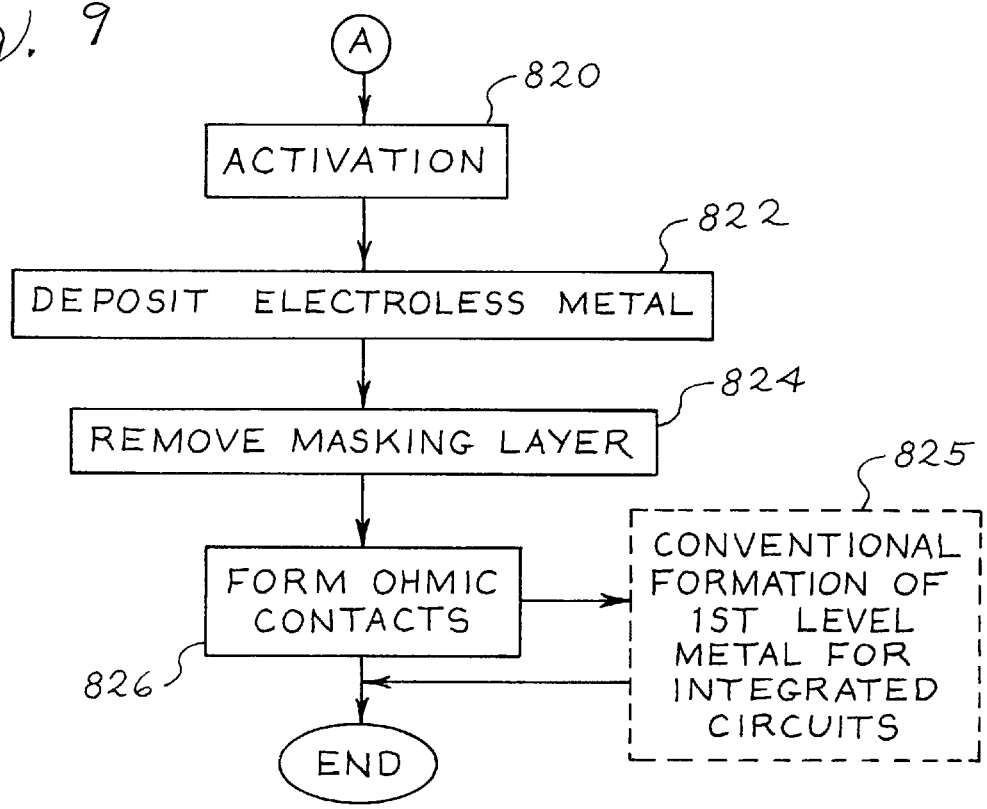
Figure 10:
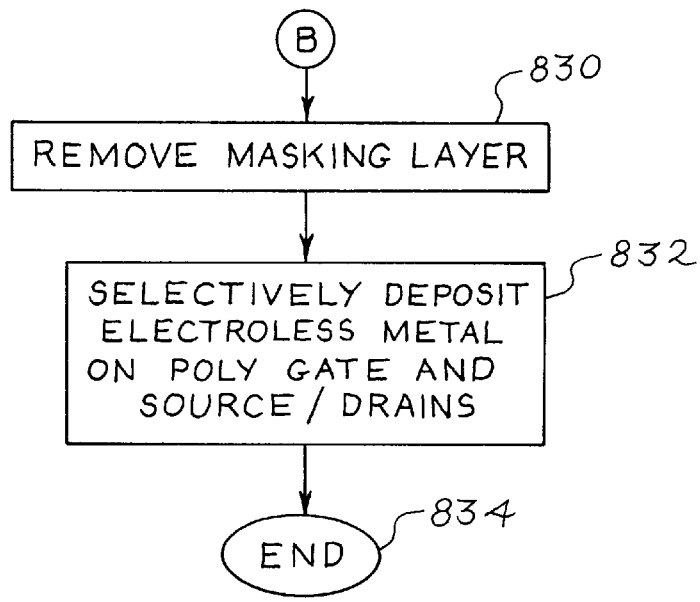

Referring now to FIG. 8, FIG. 9 and FIG. 10, they show a method for manufacturing a field effect transistor. The method begins at step 800.

At step 802, field oxide and diffusion regions are defined on the surface of a semiconductor substrate, such as a semiconductor wafer. The diffusion areas represent areas where active devices such as transistors will be formed. Field oxide islands separate and isolate the diffusion areas. At step 804, a layer of polysilicon is deposited on the surface of the semiconductor substrate and patterned using conventional photolithographic techniques. The polysilicon is patterned to define gates of field effect transistors and interconnect regions. At step 806, the polysilicon is etched and excess polysilicon is removed, leaving behind the gates of the field effect transistors. At step 808, spacer oxide is formed and patterned to define spacers on either side of the polysilicon gate. At step 810, a source/drain implant occurs, doping the source and drain regions.

At step 812, a masking layer is deposited on the surface of the semiconductor substrate. The masking layer may be any suitable material, such as resist, low-K dielectric, silicon dioxide or silicon nitride. At step 814, a photoresist material is deposited on the masking layer and at step 816, the masking layer is etched to expose the top surface of the polysilicon gate. The duration and other parameters of the etching step 816 must be controlled to ensure that only the top surface of the polysilicon gate is exposed. At step 818, the polysilicon gate is etched, preferably using a reactive ion etch process, until a predetermined etch depth is achieved. The etch depth may be any suitable depth to permit definition of a trench between the top surface of the polysilicon gate and the spacer oxide walls on either side of the polysilicon gate.

The process flow diverges at this point. Two optional embodiments are presented. A first embodiment continues with step 820. At step 820, an activation solution is applied to the surface of the semiconductor substrate. The activation solution, preferably containing palladium, silver, gold or another suitable metal, forming catalytic sites on the exposed polysilicon of the polysilicon gate in the trench between the first spacer and the second spacer. At step 822, electroless metal, such as nickel, cobalt, nickel phosphide, cobalt phosphide, nickel tungsten phosphide, or cobalt tungsten phosphide is deposited on the surface containing the catalytic sites. In this manner selective electroless metal deposition, a metal/polysilicon layer is formed on selective portions of the polysilicon gate. No electroless metal is deposited on regions other than the exposed polysilicon gate, other regions are protected by the masking layer.

At step 824, the masking layer is removed. This may be done by any conventional method known for removing material of the type forming the masking layer, such as resist, low-K dielectric, silicon dioxide and silicon nitride. At step 826, ohmic contacts are formed at the source region and the drain region of the field effect transistor. Further conventional processing continues to define field effect transistors and other devices formed in the semiconductor substrate. In an alternative embodiment illustrated in FIG. 9 at step 825, the method continues with conventional formation of first level metal for an integrated circuit. The method ends at step 828.

An alternative embodiment of the present invention continues at step 830, following step 818. At step 818, the polysilicon gate had been etched to form a trench above the polysilicon gate and between the oxide spacers. At step 830, the masking layer is removed using conventional semiconductor processing techniques to expose the source region and the drain region on either side of the polysilicon gate. At step 832, by selective electroless metal deposition, a metal/polysilicon layer is formed on selected portions of the polysilicon gate as well as on the source and drain regions. Preferably, prior to deposition of the electroless metal, the exposed silicon surface of the source and drain regions and polysilicon gate are contacted with an activation solution.

Following step 832, the method continues with conventional processing of the semiconductor substrate to define the remainder of the field effect transistor and other devices contained on the semiconductor substrate. The method then ends at step 834.

From the foregoing, it can be seen that the present invention provides a method for manufacturing a field effect transistor having a metal/polysilicon gate formed by selective electroless metal deposition. A trench is formed on the top surface of a polysilicon gate by selective etching of the polysilicon. Then, by selective deposition, electroless metal is deposited on the polysilicon gate to form the metal/polysilicon gate. Since the source and drain regions are protected by an insulating masking layer, the possibility of bridging and short circuiting are reduced. In a further embodiment, prior to selective deposition of electroless metal, the source and drain are exposed by removing the masking layer. Because of the highly selective deposition of electroless metal on silicon and polysilicon, metalization for the source and drain regions as well as for the metal/polysilicon gate is formed at the same process step, essentially eliminating the possibility of bridging and short circuiting that accompanies prior art silicide materials.

While a particular embodiment of the present invention has been shown and described, modifications may be made. It is therefore intended in the appended claims to cover all such changes and modifications which fall within the true spirit and scope of the invention.

We claim:

1. A method for manufacturing a field effect transistor, the method comprising the steps of:

forming source and drain regions in a semiconductor substrate;

depositing polysilicon on a surface of the semiconductor substrate between the source and drain regions;

forming first and second oxide spacers adjacent the polysilicon on the surface of the semiconductor substrate;

forming a masking layer covering substantially all the semiconductor substrate;

selectively removing portions of the masking layer to expose at least selected portions of the polysilicon;

removing a part of the selected portions of the polysilicon to an etch depth to define a trench between the first and second oxide spacers, the trench exposing a deposition surface of the polysilicon for forming the metallpolysilicon layer; and selectively depositing electroless metal to form a metal/polysilicon gate in the trench at the selected portions of the polysilicon.

2. A method for manufacturing a field effect transistor as recited in claim 1 wherein selectively removing portions of the masking layer comprises removing only a portion of the masking layer over the polysilicon.

3. A method for manufacturing a field effect transistor as recited in claim 2 wherein selectively removing portions of the masking layer filler comprises removing portions of the masking layer covering the source and drain regions and wherein the method further comprises the step of selective deposition of electroless metal on the source and drain regions.

4. A method for manufacturing a field effect transistor as recited in claim 1 wherein the electroless metal comprises a metal selected from the group consisting of nickel, cobalt, nickel phosphide, cobalt phosphide, nickel tungsten phosphide and copper tungsten phosphide.

5. A method for manufacturing a field effect transistor as recited in claim 1 wherein the method further comprises the step of:

after exposing the deposition surface of the polysilicon, exposing source/drain deposition surfaces of the source and drain regions; and selectively depositing electroless metal on the source and drain regions as well as the selected portions of the polysilicon.

6. A method for manufacturing a field effect transistor as recited in claim 5 wherein the electroless metal comprises a metal selected from the group consisting of nickel, cobalt, nickel phosphide, cobalt phosphide, nickel tungsten phosphide and cobalt tungsten phosphide.

7. A method for manufacturing a field effect transistor, the method comprising the steps of:

forming a polysilicon gate on a surface of a semiconductor substrate, the polysilicon gate having a predetermined thickness;

forming a source region in the semiconductor substrate on a first side of the polysilicon gate and forming a drain region in the semiconductor substrate on a second side of the polysilicon gate;

forming a first spacer immediately adjacent the first side of the polysilicon gate and a second spacer immediately adjacent the second side of the polysilicon gate, the first spacer and the second spacer extending from the surface of the semiconductor substrate to substantially a top surface of the polysilicon gate;

exposing a deposition surface, including removing a part of the polysilicon gate between the first spacer and the second spacer from the top surface of the polysilicon gate to an etch depth, the etch depth being less than the predetermined thickness of the polysilicon gate, the first spacer, the second spacer and the deposition surface of the polysilicon gate defining a trench; and filling the trench by selectively depositing electroless metal in the trench to form a metal/polysilicon gate.

8. The method as defined in claim 7 further comprising the steps of forming a masking layer on the surface of the semiconductor substrate except the top surface of the polysilicon gate.

9. The method as defined in claim 8 further comprising the step of, after selectively depositing the electroless metal, removing the masking layer.

10. The method as defined in claim 8 further comprising the steps of:

before selectively depositing the electroless metal, removing the masking layer and exposing the source region and the drain region; and selectively depositing electroless metal on the source region and the drain region to form ohmic contacts.

11. The method as defined in claim 8 further comprising the step of selecting the electroless metal from the group consisting of nickel, cobalt, nickel phosphide, nickel tungsten phosphide, cobalt phosphide, and cobalt tungsten phosphide.

12. The method as defined in claim 8 further comprising the step of, before selectively depositing the electroless metal, treating the deposition surface with an activating catalyst.

13. The method as defined in claim 8 further comprising the step of selecting the activating catalyst from the group consisting of palladium, silver and gold.

* * * * *